United States Patent [19]

Sprengling

[11] Patent Number: 4,496,415
[45] Date of Patent: Jan. 29, 1985

[54] METHOD FOR IMPREGNATING RESIN POWDER DIRECTLY INTO A LAMINATE LAY UP

[75] Inventor: Gerhard R. Sprengling, Derry Township, Westmoreland County, Pa.

[73] Assignee: Westinghouse Electric Corp., Pittsburgh, Pa.

[21] Appl. No.: 366,623

[22] Filed: Apr. 8, 1982

[51] Int. Cl.³ .............................................. B32B 31/00
[52] U.S. Cl. .................................. 156/283; 156/291; 427/195; 428/403
[58] Field of Search ............... 156/279, 276, 291, 290, 156/283; 428/198, 195, 403; 427/195

[56] References Cited

U.S. PATENT DOCUMENTS

| | | | |
|---|---|---|---|
| 2,199,597 | 5/1940 | Renfrew et al. | 156/283 |
| 3,540,974 | 11/1970 | Broadhurst | 156/279 |
| 3,676,269 | 7/1972 | Schaetti | 156/291 |
| 3,916,065 | 10/1975 | Moriconi et al. | 428/403 |
| 4,061,823 | 12/1977 | McCaskey et al. | 428/282 |
| 4,164,386 | 8/1979 | Stabler | 425/371 |
| 4,182,791 | 1/1980 | Meyering et al. | 156/283 |
| 4,241,469 | 12/1980 | Perazzo | 428/198 |
| 4,326,003 | 4/1982 | Bouhaniche | 156/291 |

OTHER PUBLICATIONS

Guettinger et al., 7th Annual Conference Reinforced Plastics Composite Institute, "Improvements in Continuous Production of Reinforced Sheet", Society of the Plastics Industry, Inc., Jan. 1982, Session 10–D, pp. 1–5.

Primary Examiner—Jay H. Woo
Assistant Examiner—Timothy W. Heitbrink
Attorney, Agent, or Firm—D. P. Cillo

[57] ABSTRACT

Dry resin powder can be used to impregnate a laminate lay up, by coating a dry resin powder directly onto a bare fibrous sheet, and then subjecting a plurality of sheets including at least one dry resin-coated sheet to an amount of heat and pressure effective to consolidate the sheets.

14 Claims, 1 Drawing Figure

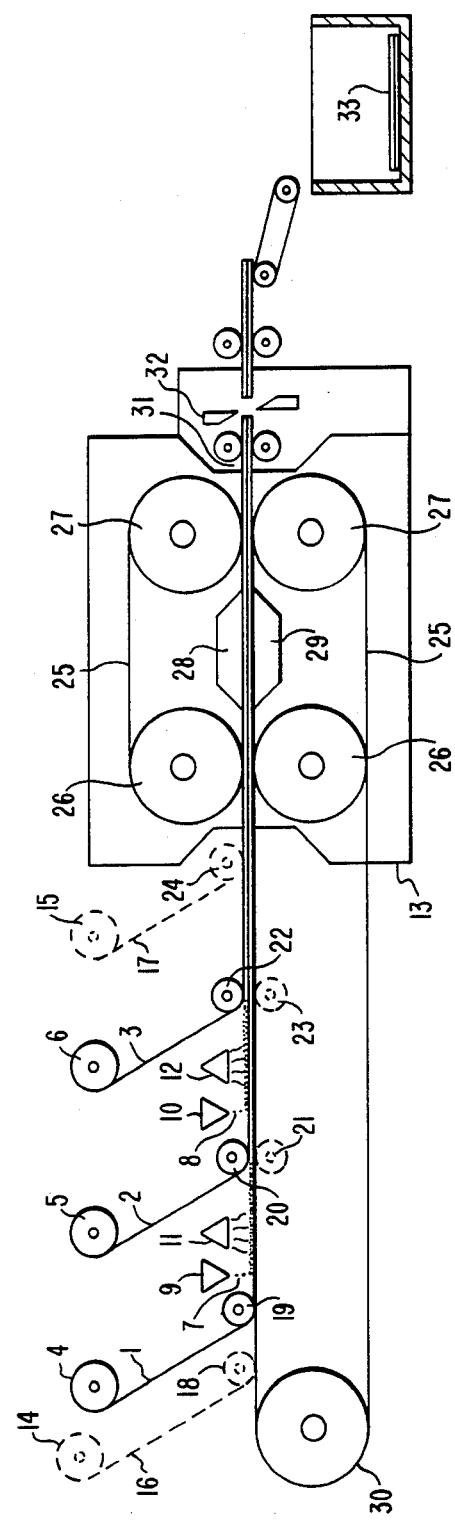

METHOD FOR IMPREGNATING RESIN POWDER DIRECTLY INTO A LAMINATE LAY UP

BACKGROUND OF THE INVENTION

Heretofore, almost all laminated structures have been manufactured using thermoset resin solution impregnation techniques as taught, for example, by McCaskey et al., in U.S. Pat. No. 4,061,823. In the usual procedure, thermoset resins in the B-stage, i.e., still fusible and soluble, are dissolved in solvent, and the resulting solution used to completely impregnate fibrous woven substrate material. Then, the solvent is driven off in a long, specially designed oven. After leaving the oven, the B-staged resin is distributed throughout the interior of the fibrous material, to provide a prepeg substrate.

The next step in laminate manufacture is to cut the resin impregnated prepreg to desired sheet dimensions, and subject a superimposed plurality of said prepreg sheets to heat and pressure, usually in a flat bed press, at about 150° C. and 1,500 psi. This consolidates the sheets into a bonded, completely cured, unitary structure. The purpose of the above procedure is to bring an even distribution of thermoset resin throughout the interior of the sheets of fibrous substrate material, and intimate contact, or bond, between each fiber filament in such substrate material within the matrix resin.

The usual method described above has certain disadvantages, however. One disadvantage is the expense of operating the special drying ovens and the disposal of solvent vapors generated in the ovens. Yet other disadvantages are the required use of strong, and expensive, woven fabric substrate material, which is able to resist the tension of pulling through the oven, and problems associated with storage of thermost resin impregnating solutions, for a commercially acceptable time period, without their starting to gel.

Renfrew et al., in U.S. Pat. No. 2,199,597, tried to solve some of these laminate manufacturing problems, by first impregnating or coating a fibrous substrate, such as cotton fabric or absorbent paper, with an adhesive, and then applying a thermoset phenolic resin powder, which adheres to the adhesive at the top surface of the substrate. A plurality of such powder-coated sheets are then assembled and heat and pressure consolidated in a flat bed press, at about 140° C. and 1,500 psi. The problem with this process, however, is that the thermoset resin would fail to completely impregnate the fibrous substate due to the blocking effect of the adhesive.

Guettinger et al., 7th Annual Conference Reinforced Plastics Composite Insitute, Society of the Plastics Industry, Inc., January 1982, Session 10-D, pp. 1-5, while analyzing the economies of continuous lamination, described continuous double belt press blank formation, where glass fibers, carbon fibers, woven mats, aramid fibers, wood flour, and glass spheres are introduced into polypropylene, polyester or polyamide matrices. The blanks are then slit or trimmed in the product flow direction, for use in subsequent processes, such as molding to form automotive components. In one process, the resin, in powder form, is first extruded through a slotted die to provide a sheet of plastic material which is passed through the press between glass fiber mats. The resin sheet material can also be fed from a roll as a continuous room temperature sheet. This process, however, has the disadvantage of requiring expensive, initial melt processing of the resin powder to continuous sheet form before feeding into the continuous laminating process. Also, the use of a continuous sheet of resin will not allow complete resin impregnation into the fibrous mats.

What has been long needed is an efficient process for laminating either a nonwoven, loosely felted substrate, or a fibrous woven substrate; which allows good resin impregnation of the substrate, yet eliminates heat energy requirements, solvent pollution, and impregnating resin pot life problems.

SUMMARY OF THE INVENTION

The above need has been met and the above problems solved by the following steps of the preferred process: (1) applying a coating of discrete thermosettable B-staged dry resin particles, having a particle size of between about 20 microns and about 1,000 microns, directly onto a bare, porous, fibrous, woven or nonwoven substrate material, and then (2) subjecting a plurality of substrates, including at least one resin/coated substrate from step (1), to heat and pressure, preferably in a continuous press laminating procedure, to consolidate the substrates into a bonded, completely cured, unitary structure. This process eliminates the use of drying ovens and solvent processing between steps (1) and (2), and the use of adhesives or costly extruded sheet plastics.

Unexpectedly, after pressing at a temperature above the melting point of the thermoset resin, the resin powder particles melt flow through the fibrous substrate, wetting and adhering to the fiber filaments as effectively as a resin solution impregnation technique. Moreover, the bond between fibers and resin using the dry powder technique is equivalent to that in laminates in which every sheet of substrate is resin solution impregnated in the normal fashion. In most cases, there is usually some sifting of the resin particles into the interstices of the fibrous substrate, allowing outstanding resin penetration during melt flow in the laminating process. In some instances, where the substrate is very porous, and there is a good sifting effect of small resin particles, only a single substrate sheet need be used, where the pressing would still serve to heat and consolidate the sheet.

To ensure adherence of the resin powder particles to the substrate, the substrate can be electrically charged, and the powder applied by giving the particles an electrical charge of opposite sign to that of the substrate; as in electrostatic spraying. Such charge-attracted particles will be held in fixed position on the substrate surface after deposition, at least until the charges have dissipated or neutralized each other, which does not take place rapidly for the high resistivity surfaces commonly involved. Or, deposited particles may be fixed more firmly in position by quick heating, as with infrared radiation, thus causing them to melt partially and adhere.

Beyond the fact that the usual solvent prepreg treating ovens are no longer required with this dry powder process of making laminates, other advantages also accrue. For example, a catalyzed resin is normally less reactive in solid form that it would be in a solution at the same temperature. Resins used in making laminates must normally be already catalyzed when applied to the substrate. There is therefore an advantage inherent in the new method, in that storage stability of the resins to be used is much greater. Moreover, in normally solvent impregnated prepregs, the B-stage resin applied is distributed over a very large surface area of fibers. In this state of distribution, many resins are subject to the effects of humidity from ambient air in storage, to the detriment of final product properties. Such sensitivity is almost completely avoided by the new particle deposition, where resin distribution over a large surface area only takes place during final pressing, when no longer exposed to air.

The preferred method of applying the dry resin powder described above is to use it in continuous production of laminates in a device designed for this purpose, as is well known in the art. The making of prepreg and its pressing into laminates are thus combined into a single overall continuous process. Even if the powdered resin is not attached but mostly lying on the surface of each layer of fibrous substrate, it will not be displaced if not operations intervene between its deposition and pressing into a laminate, which is the case in a continuous laminating machine. This can be true even though multiple layers of substrate each with resin deposited on it are used. In that case, each layer serves to hold in place the powder deposit on the next lower layer.

BRIEF DESCRIPTION OF THE DRAWING

For a better understanding of the invention, reference may be made to the preferred embodiment, shown in the accompanying drawing, which is a schematic diagram of one method of manufacturing a consolidated laminated article according to this invention, utilizing a continuous laminating type machine.

DESCRIPTION OF THE PREFERRED EMBODIMENTS

Referring now to the Drawing, flexible, bare, porous sheets of fibrous material 1 and 2, such as cellulose paper, cotton fabric, polyester fabric, polyethylene terephthalate porous sheet, polyamide porous sheet, mica paper, glass fabric, and the like, where the term "fabric" is meant to include both woven and nonwoven materials, are continuously fed from payoff reels 4 and 5, respectively. The sheet material will generally have a thickness of between about 0.001 inch to about 0.050 inch, usually between about 0.005 inch to about 0.015 inch, and will not contain any adhesive materials coated on or impregnated therein.

A thermosettable, B-staged, dry resin powder 7 and optionally 8 is applied directly to the moving fibrous sheets by resin powder application means 9 and optional resin powder application means 10, respectively. In this instance, sheet 2 will be superimposed on sheet 1, where the powder 7 will be disposed between sheets 1 and 2 and a core layer formed. This core could consist of up to 20 powder-coated superimposed sheets. Of course, resin free sheets can also be included in the core, and any combination of powder coated, or uncoated sheets is considered within the scope of this invention. Resin powder, alone or with pigments, metal flakes, dyes or fillers, could also be disposed on the top sheet of the core.

The resin powder application means can be a vibrating sifter, electrostatic sprayer, or any other means known in the art that is effective to provide uniform, non-melted resin powder coverage of the fibrous sheet surface area, to provide a powder coated sheet. Some resin particles will usually sift or settle into the interior of the substrate, helping in resin melt flow penetration. The particle size range within which effective melt flow and good bonding occurs is a range of between about 20 microns and about 1,000 microns, preferably between about 37 microns (400 mesh) and about 420 microns (40 mesh). Below about 20 microns, explosive dust-air mixtures as well static problems can occur. Over about 1,000 microns, it is hard to get adequate sifting into the substrate or an even distribution of the resin particles and the melt from such large particles must flow an excessive distance.

The B-staged thermosetting resin that can be used is preferably a phenol-formaldehyde resin, a melamine resin, a dicyandiamide-formaldehyde resin or an epoxy resin, all of which are well known in the art, and described in detail in *Plastics Materials*, J. A. Brydson, D. Van Nostrand, 1966, Chapters 19, 20, and 22, herein incorporated by reference. Pigments, metal flakes, dyes or fillers of various types and colors can be included in the resin, up to about 40 wt.% of the total weight, i.e., resin plus pigment weight, in particle sizes preferably between about 20 microns and about 420 microns, to add color or marbled effects, and the like. Additionally, small effective amounts of surfactants or flow promoters, and the like, can be added to the resin, as is well known in the art, to provide good flow and spreading characteristics to the resin powder.

Infrared radiant heaters 11 and 12 may optionally be used to assure film adherence of the thermoset resin particles to the surface of the porous sheet. The heaters should provide a particle temperature of about 50° C. to about 200° C. The temperature, of course, will vary with the resin powder used, and must be effective to cause softening of the resin powder immediately after application without complete cure. The resin particles are, as stated above, in the B-stage, and so capable of softening, melt flowing and subsequent heat curing to an infusible state.

Payoff reel 6 can optionally feed a flexible, B-staged, thermoset resin-impregnated, decorative print or overlay paper sheet 3, to provide a top layer for the laminate. The decorative print sheet could be colored or patterned, and the overlay could contain a clear melamine or other type thermoset protective resin, as is well known in the art. Sheet 3 could also be an unimpregnated, bare sheet of paper, glass cloth, or the like, where the resin coverage of sheet 2, immediately below it, is sufficient to bond sheet 3 to the bottom sheets, after melt flow in the continuous laminating machine 13.

Also shown are optional payoff reels 14 and 15, either or both of which can feed a thin, flexible metal foil 16 and 17, respectively, such as aluminum or copper, into the continuous laminator. Foils 16 and 17 would not be used if sheet 3 was a decorative print or overlay. Rollers 18, 19, 20, 22 and 24 can be used when their respective payoff reels are in service. If desired, rollers 20 and 22 can be mated with optional, vertically opposed rollers 21 and 23, respectively, and both pairs heated to provide resin particle softening and some melt flow. Passing between heated rollers prior to actual entry into the continuous laminator 13 can provide a more uniform resin distribution within the interstices of the plurality of substrates. The feed system shown in the drawing, lays up the sheets to provide a stress-free feed, so that inexpensive, nonwoven fabric can be used as a substitute for woven substrate material. The use of such nonwoven materials is highly advantageous, and provides a product having outstanding structural integrity at very substantial cost savings. As can be seen, no solvent elimination means are used or needed, nor are adhesives needed nor solid, continuous resin sheets used as an impregnating medium.

The continuous laminating machine 13, comprises two moving endless steel belts 25, each of which is mounted on a pair of heated, vertically opposed drums or rolls 26 and 27, with the bottom belt also revolving about roll 30. The belts define a treatment zone within the continuous laminator, and are held in precisely spaced relationship by a pair of pressure plates 28 and 29. Also shown is exterior roller 30, the top belt extension to which provides a flat surface for the lay up. The belt speed, and thus the feed speed of the lay up sheets through the machine can vary from about 0.1 to about 30 meters/minute. Such continuous laminating machines, i.e., continuous twin belt presses, well known in the art and are described in detail in U.S. Pat. No. 4,164,386, herein incorporated by reference.

Pressure between pressure plates 28 and 29, are usually within the range of between about 50 psi. and about 500 psi. Roller temperatures of up to about 250° C. can be used in the continuous laminating machine, to cause melt flow impregnation of the B-staged thermosettable resin particles on top of and sifted within the porous substrate sheets, i.e., flow of resin into and through the fibrous structure of the porous sheets to wet and bond together the fibers of each sheet and to also bond the individual sheets together. To ensure minimum resin adherence to the belt 25, parting agents can be used, or the belt can be chrome plated, as is well known in the art.

Upon reaching the curing temperature of the resins used in the sheets, the entire composite lay up of resin-impregnated layers will cure to form a unitary, bonded, laminate 31. The cured, unitary laminate will exit the continuous laminating machine and be cut into desired lengths by cutting means 32, such as a shear blade, saw, or the like. A surface sanding stage, not shown, can be added before the cutting stage. The cut laminates 33 are then stored for use. As described hereinbefore, only sheets 1 and 2, resin powder 7, resin powder application means 9, and continuous laminator 13 need be used in the method shown in the Drawing. The other optional sheets can be used to provide thick laminates, decorative laminates, or copper clad printed circuit boards, and the like. However, there may be some instances where a consolidated material is required consisting only of sheet 1 coated with resin 7. In this case, sheet 1 would be fairly porous, and the resin 7 would be of fairly small particle size, so that, preferably, it could sift in large part into the interior of the sheet. The powder coated sheet would still be heat and pressure consolidated to melt flow the resin powder and impregnate the sheet, to form a consolidated material.

Another method of producing laminates using the dry, resin powder application technique of this invention, utilizes a flat bed press. In this method, a plurality of bare, porous sheets of fibrous material, forming a core layer, are covered with thermosettable B-staged dry resin powder directly applied by any suitable means and superimposed on each other. The powder can optionally be electrically charged with a sign opposite that of the sheets, or softened by heating after application; to ensure film adherence to the sheets. A print sheet or overlay sheet, or both, can be placed on top of the core. The core can be disposed between release sheets and steel plates, as is well known in the art, between the heated press members of a standard flat bed press. The same type of resin powder, resin powder coverage, resin particle size, and porous, substrate sheet material would be used as described hereinabove.

Pressures of up to 2,000 psi, and temperatures of up to 185° C. can be used to cause melt flow impregnation of the B-staged thermosettable resin particles. Upon reaching the curing temperature of the resins used in the sheets, the entire composite lay up of resin impregnated layers will cure to form a unitary, bonded, laminate. The cured, unitary laminate will be allowed to cool, and will then be cut into desired shape and optionally surface sanded or otherwise finished before being stored for use.

EXAMPLE 1

Two bare sheets of 0.015 inch thick Kraft paper were passed between a pair of vertically opposed rollers, heated to 170° C., in such a manner that on the input side, one length of paper was horizontal, and the other came in at an angle. Powdered, dry phenolic resin was fed to the angle between the sheets where the two lengths met at the roller nip. The resin powder was evenly dispensed from a non-heated feed trough, with uniform coverage directly onto and across the width of the paper, with some sifting into the body of the paper. The phenolic resin was a resole type, carried to a ball and ring of about 100, to enable powdering. The particle size range was between about 40 to about 325 microns.

Due to the temperature of the nip rollers, the powdered resin melted, to provide resin deposition of about 35% of the weight of paper passing through the nip rollers. Immediately behind the nip rollers, the joined lengths of paper were passed into a type of double belt, continuous laminating apparatus, affording an even pressure of 200 psi. at a temperature of 180° C., operating at a feed rate of about 0.2 meter/minute. The consolidated length emerging from the continuous laminating apparatus was cut to size. It was found that the dry power melt flowed through the fibrous substrates, cured, and bonded them into a unitary structure. Higher feed rates would be expected to provide equally outstanding results.

EXAMPLE 2

A dicyandiamide core laminate was made by laying up eight sheets of 12 inch by 12 inch, 1½ oz. per sq.ft. unwoven glass mat, each mat uniformly covered with powdered, dry, relatively low flow, dicyandiamide-aldehyde resin, having a particle size of about 45 microns. The lay up was placed in a flat bed press, each layer of mat sandwiching the dry resin powder to prevent loss during handling. The lay up was molded at 140° C. for 30 minutes at a pressure increased to 1,000 psi. After release, the laminate was cooled.

A ⅛ inch thick, unitary structure was provided, the resin powder melt flowing through the fibrous glass mats, curing and bonding them together. The water uptake and dimensional stability on exposure to boiling water of this laminate were found equivalent to those of a conventional laminate made from woven glass cloth, solvent impregnated and tower treated prepreg, showing that wetout and adhesion of resin to fiber was equivalent in both methods.

Using the same glass mat and resin covered sheets, a standard colored "print" sheet and protective "overlay" sheet, both of high grade cellulose paper impregnated with the dicyandiamide-aldehyde resin described above, were superimposed on the core lay up. After molding at 140° C. for 30 minutes at 1,000 psi, and cooling, a unitary, consolidated, decorative laminate was provided.

It was also found that both uncolored fillers, such as mica or glass frit, pigments such as chrome green, and platy metal such as aluminum or bronze powder or flakes, could be incorporated into the dicyandiamidealdehyde resin. Such pigments and platy metal powder could also be applied to the top dry resin powder core lyer in a selected pattern, such as a diamond pattern. Due to the lack of transverse resin flow, the patterns applied remained sharp after high pressure molding. Epoxy resin can also be substituted for the dicyandiamide resin, and copper cladding laminated to the core.

All of these product laminates tended to be flatter than those made using solvent impregnation methods; and laminates equivalent to the conventional ones in properties could be made at a lower resin content, apparently because this dry powder process afforded free flow of otherwise trapped air to the edge of the sheet until late in the process. Of course, no solvent pollution or pot life problems were encountered using this direct dry powder process.

I claim:

1. A method of making a metal clad laminate, useful for circuit boards, comprising the steps of:
   (A) uniformly applying a uniform deposit of dry, thermosettable, B-staged resin particles as a powder, having a particle size of between about 20 microns and about 1,000 microns, directly onto a bare, porous, fibrous sheet material, to provide a sheet uniformly covered with a uniform deposit of resin powder particles, and having resin powder particles sifted into interstices of the porous sheet,
   (B) contacting the powder coated sheet with a metal foil sheet, and then
   (C) applying heat and pressure to the sheets, to cause the resin powder particles on top of and sifted within the fibrous sheet material to melt flow into and through the fibrous sheet material, to fill the pores and impregnate the fibrous sheet material, and to also bond said impregnated sheet material to the metal foil, to provide a unitary, consolidated metal clad laminate.

2. The method of claim 1, where non-pattern the metal foil used in step (B) contacts dry resin powder on top of the bare sheet, and the sheets are heat and pressure consolidated in a continuous laminating machine.

3. The method of claim 1, where the bare, porous sheet is a fibrous nonwoven material.

4. The method of claim 1, where the dry powder is applied to a plurality of moving bare, porous sheets in step (A) each powder coated sheet being superimposed on another to form a core layer of sheet material.

5. The method of claim 4, where the metal foil used in step (B) contacts dry resin powder on top of the core.

6. The method of claim 4, where the metal foil used in step (B) is a flexible copper foil.

7. The method of claim 4, where the applied dry resin powder is held in place by infrared heat effective to soften the resin immediately after application.

8. The method of claim 4, where the bare, porous, fibrous sheets are selected from the group consisting of cellulose paper, cotton fabric, polyester fabric, polyethylene terephthalate sheet, polyamide sheet, mica paper, and glass fabric, and the thermosettable resin power is selected from the group consisting of phenolic resin, melamine resin, epoxy resin, and dicyandiamide-formaldehyde resin.

9. The method of claim 4, where the bare, porous sheets are a fibrous nonwoven material.

10. The method of claim 4, where at least one of the bare sheets is glass fabric and the metal foil used in step (B) is a flexible copper foil.

11. A method of making a copper clad laminate, useful for circuit boards, comprising the steps of:
    (A) uniformly applying a uniform deposit of dry, thermosettable, B-staged resin particles as a powder, having a particle size of between about 20 microns and about 1,000 microns, directly onto a moving, bare, porous, fibrous sheet material, to provide a sheet uniformly covered with a uniform deposit of resin powder particles, and having resin powder particles sifted into interstices of the porous sheet,
    (B) contacting the moving powder coated sheet with a copper foil sheet, and then
    (C) continuously applying heat and pressure to the moving sheets in a continuous twin belt press laminating machine, to cause the resin powder particles on top of and sifted within the fibrous sheet material to melt flow into and through the fibrous sheet material, to fill the pores, bond all the fibers together and impregnate the fibrous sheet material, and to also bond said impregnated sheet material to the copper foil, to provide a unitary, consolidated copper clad laminate.

12. The method of claim 11, where the bare, porous fibrous sheet is a nonwoven material.

13. The method of claim 11, where the dry powder is applied to a plurality of moving bare, porous sheets in step (A), each powder coated sheet being superimposed on another to form a core layer of sheet material.

14. The method of claim 11, where the bare, porous, fibrous sheets are selected from the group consisting of cellulose paper, cotton fabric, polyester fabric, polyethylene terephthalate sheet, polyamide sheet, mica paper, and glass fabric, and the thermosettable resin powder is selected from the group consisting of phenolic resin, melamine resin, epoxy resin, and dicyandiamideformaldehyde resin.

* * * * *